(12) United States Patent
Wakabayashi et al.

(10) Patent No.: US 6,418,155 B1
(45) Date of Patent: Jul. 9, 2002

(54) LASER DEVICE

(75) Inventors: Osamu Wakabayashi, Hiratsuka; Tatsuya Ariga; Toru Igarashi, both of Oyama; Shoichi Sakanishi, Hiratsuka; Tomokazu Takahashi, Koga, all of (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/297,372

(22) PCT Filed: Nov. 5, 1997

(86) PCT No.: PCT/JP97/04022
§ 371 (c)(1),
(2), (4) Date: Jun. 17, 1999

(87) PCT Pub. No.: WO98/20586
PCT Pub. Date: May 14, 1998

(30) Foreign Application Priority Data

Nov. 5, 1996 (JP) .............................................. 8-292631

(51) Int. Cl.⁷ ................................................. H01S 3/10
(52) U.S. Cl. ........................ 372/29.021; 372/25; 372/30
(58) Field of Search ................................. 372/30, 29.021, 372/29.015, 25

(56) References Cited

U.S. PATENT DOCUMENTS

| | | | | |
|---|---|---|---|---|
| 3,601,575 A | * | 8/1971 | Myers et al. | 219/121 |
| 3,622,742 A | * | 11/1971 | Cohen et al. | 219/121 |
| 4,099,262 A | * | 7/1978 | Bright et al. | 365/126 |
| 5,175,425 A | * | 12/1992 | Spratte et al. | 235/494 |
| 5,463,650 A | * | 10/1995 | Ito et al. | 372/57 |
| 6,008,497 A | * | 12/1999 | Mizzoguchi et al. | 250/492.1 |
| 6,084,897 A | * | 7/2000 | Wakabayashi et al. | 372/38 |
| 6,128,323 A | * | 10/2000 | Myer et al. | 372/38 |

FOREIGN PATENT DOCUMENTS

| | | |
|---|---|---|
| JP | 5-167162 | 7/1993 |
| JP | 6-61565 | 3/1994 |
| JP | 6-169123 | 6/1994 |
| JP | 7-106678 | 4/1995 |

\* cited by examiner

*Primary Examiner*—James W. Davie
(74) *Attorney, Agent, or Firm*—Varndell & Varndell, PLLC

(57) ABSTRACT

A laser device which repeats a cycle of burst mode operation in each of which continuous oscillating operations for continuously pulsatively oscillating laser light by a prescribed number of times and stopping operations for stopping the pulsative oscillation for a prescribed pausing time are alternately executed, controls the power supply voltage of the laser device so that each output energy of the pulsative oscillation can become coincide with a target value, finds the difference between the output voltage of each pulse and the target value at every pulse and, for a pulse for which the difference exceeds tolerance limits, corrects and updates the power supply voltage value stored in the voltage data table means corresponding to the pulse number of the pulse and the measured oscillation pausing time by using the control gain of a control gain setting means set in the block corresponding to the pulse number and the measured oscillation pausing time and the difference, so as to always make the pulse energy of all pulses for the continuous pulsative oscillation constant and further improves the accuracy of optical machining.

25 Claims, 10 Drawing Sheets

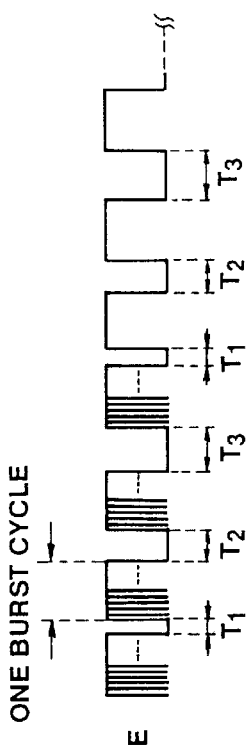
FIG.5(a) SELF RECOVERY MODE
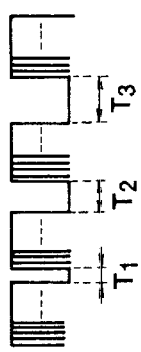
FIG.5(b) SELF LOCKING MODE
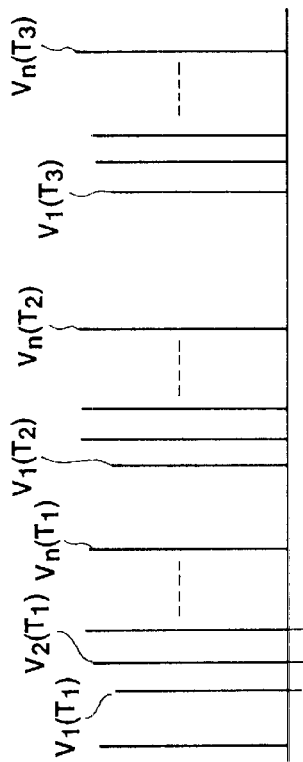
FIG.6(a)
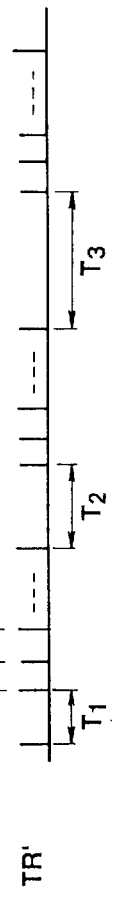
FIG.6(b)

LASER DEVICE

TECHNICAL FIELD

This invention pertains to laser devices for using laser beams to output prescribed light to expose semiconductors, polymer materials, and inorganic materials and for outputting laser beams for machining apparatuses that perform machining processes, and more particularly to improvements therein in order to obtain constantly uniform pulse energy values when implementing burst mode operations wherein a continuous oscillation action for generating pulses of laser light a prescribed number of times continuously is alternated over and over with a stopping action for stopping the pulse generation for a prescribed time.

BACKGROUND ART

In the field of semiconductor exposure devices which employ UV light beams, it is found necessary to implement fine precision exposure light quantity control in order to maintain circuit pattern resolution above a certain level. However, with the excimer lasers that are used as the light sources in these semiconductor exposure devices, there is variation in the pulse energy from one pulse to the next because they are so-called discharge excitation gas lasers. There is a need to reduce this variation in order to improve the precision of exposure light quantity control.

Semiconductor exposure devices, on the other hand, alternately repeat exposures with stage movements. More specifically, in FIG. 9 is diagrammed a semiconductor wafer W whereon are arranged a plurality of IC chips 90, and, when performing exposures with a stepper, upon the completion of exposure processing wherein one IC chip 90 on the semiconductor wafer W has been irradiated with a plurality of continuous light pulses, either the wafer W or the optical system is shifted so that the next unirradiated IC chip 90 can be irradiated with continuous light pulses, whereupon, after this stage shift, light irradiation is performed as before. Upon the completion of this exposure operation on all of the IC chips 90 on the semiconductor wafer W, alternating the exposures and the stage shifts in this manner, the completely exposed wafer W is carried away and the next wafer W is placed in the irradiation position so that the same light irradiation process can be repeated again.

Thus a semiconductor exposure device is fashioned so that exposures and stage shifts are alternately repeated. The operation of an excimer laser constituting the light source in such an exposure device, therefore, as diagrammed in FIG. 10, involves a burst mode operation wherein a continuous pulse generation operation for pulse-generating laser beams continuously a prescribed number of times is repeated together with an oscillation stop interval t during which pulse generation is suspended for a prescribed time interval.

More specifically, in the burst mode operation diagrammed in FIG. 10, the oscillation stop interval t corresponds to the time required to move the stage in the semiconductor exposure device. This oscillation stop interval t, however, for various reasons, is not necessarily constant. When one wafer is being exchanged with another, for example, the oscillation stop interval will be much longer than when moving the stage between IC chips. Also, the oscillation stop interval needed when shifting between IC chips in the same row will be very different from the oscillation stop interval needed when shifting from one IC chip to another IC chip in a different row. When the number or arrangement of the IC chips on the wafer changes, moreover, that will also cause the oscillation stop intervals to change. There are various other factors that cause changes in the oscillation stop interval. It should be noted also that, in FIG. 10, the energy intensity of each pulse is represented for a case where the excitation intensity (discharge voltage) is fixed at a constant value.

In such burst operations as this, when the length of the oscillation stop interval t varies, these variations cause large changes in the output of individual laser pulses, as diagrammed in FIG. 11. More specifically, when the oscillation stop interval t is short, the effects of past laser generations remain in the form of rises in gas temperature, disruption of the gas or gases inside the laser chamber, and localized rises in electrode temperature, etc. When the oscillation stop interval t is long, on the other hand, the effects of past laser generations on the laser disappear. For this reason, even if the laser discharge voltage is held constant, as is diagrammed in FIG. 11, when the stop time is short the output energy will be smaller, and when the stop time is long the output energy will be larger. Thus the laser output will change greatly in response to the oscillation stop interval.

In the meantime, as noted above, an excimer laser is a pulse discharge excitation gas laser, for which reason it is very difficult to continue oscillations so as to produce a pulse energy that is always at a constant level. There are at least two reasons for this, namely (1) density commotion in the laser gas inside the discharge space develops due to the discharges, making the next discharge uneven and unstable, and (2) localized temperature rises occur in the surface of the discharge electrodes due to these uneven discharges, etc., which result in deterioration in the next discharge and cause discharges to be uneven and unstable.

This tendency is particularly pronounced during the initial stage of the continuous pulse generation interval described above. As diagrammed in FIG. 12, in the spike region that contains the first several pulses after the completion of the oscillation stop interval t, at first comparatively high pulse energy is obtained, but thereafter the pulse energy gradually falls. This is the so-called spiking phenomenon. When this spike region is finished, the pulse energy passes through a plateau region wherein a stable value continues at a comparatively high level, and then enters a steady region.

Thus, with an excimer laser device operated in burst mode, the energy variation between pulses described above causes the precision of quantitative exposure control to decline, and the spiking phenomenon makes this variation even more pronounced, resulting in a large decline in quantitative exposure control, which is a problem.

In the face of this problem, the applicant has filed for patents on various inventions pertaining to so-called spike prevention control wherein, using the property whereby the energy of pulses generated increases as the excitation intensity (charging voltage, discharge voltage) increases, the discharge voltage (charging voltage) for the first pulse in continuous pulse generation in the burst mode is made smaller, and the discharge voltage for the following pulses is made gradually larger, thereby changing the discharge voltage for each pulse and preventing the initial energy rise due to the spiking phenomenon (Japanese Patent Application No. 4-191056, Japanese Patent Application Laid-open No. 7-106678 (Japanese Patent Application No. 5-49483), etc.).

More specifically, as based on the prior art cited above, discharge voltage data for causing the energy of each pulse in continuous pulse generation to be at a desired target value Pr, taking various parameters such as oscillation stop interval t and power lock voltage (the power supply voltage determined in response to the deterioration of the laser gas)

into consideration, are stored beforehand in a table for each pulse in the continuous pulse generation, the pulse energy Pi (where i=1, 2, . . . ) for the current continuous pulse generation is detected, this detected value Pi is compared against the pulse energy target value Pd, and, based on the results of this comparison, the discharge voltage data for each pulse previously stored, as noted above, are corrected and updated. These corrected voltage data are used as the discharge voltage data during the next burst cycle.

In the discharge voltage correction control described above, the pulse energy Pi resulting from laser oscillation is detected using the discharge voltage datum Vi stored in the table noted above, the difference $\Delta P$ (=Pi−Pr) with the target energy Pr is computed, a discharge voltage correction value $\Delta V$ (=G·$\Delta P$ where G is the gain constant) is computed according to the difference $\Delta P$, the discharge voltage datum Vi recorded in the aforesaid table is corrected using this discharge voltage correction value $\Delta V$, and thus a post-correction discharge voltage datum Vi' (=Vi+$\Delta V$) is obtained.

As based on the conventional correction control described in the foregoing, however, the gain constant G is fixed at the same value in all regions (i.e. the spike region, plateau region, and steady region) in the burst cycle diagrammed in FIG. 12, wherefore the effectiveness in suppressing variation in pulse energy is not adequate.

More specifically, looking at FIG. 13, which diagrams the relationship between excimer laser discharge voltage and pulse light power, based on these characteristics, a discharge is generated at a voltage Vc or higher and laser oscillation occurs. While the voltage is low, the pulse light power and the voltage are roughly proportional. When the voltage rises, however, saturation occurs, and the rise in pulse light power associated with a rise in voltage decreases. In FIG. 13, the change in voltage required to effect the same rise in power $\Delta P$ is represented in two types according to the size of the discharge voltage. Between the change $\Delta VL$ when the voltage is low and the change $\Delta VH$ when the voltage is high, the relationship $\Delta VL<\Delta VH$ clearly holds.

As based on the spiking prevention control described in the foregoing, on the other hand, the discharge voltage for the first several pulses is made small, and thereafter the discharge voltage is gradually made larger, so that, as a result, the discharge voltage fluctuates largely in units corresponding to the region (i.e. the spike region, plateau region, and steady region).

Thus, with the conventional spiking prevention control, despite the large fluctuations in units corresponding to the discharge voltage units of spike region, plateau region, and steady region, the gain constant G is fixed at the same value, as noted, wherefore the variation in pulse energy cannot be adequately suppressed to the level required in a semiconductor exposure device.

As based on the prior art described in the foregoing, moreover, spike killer control is implemented in the plateau region and steady region in addition to the spike region diagrammed in FIG. 12, wherefore the effectiveness in suppressing pulse energy variation in regions other than the spike region is inadequate.

The explanation for this is thought to be that, with the initial pulses of the continuous pulses, the effects of stopping laser oscillation (i.e. causing the laser to stabilize) remain strongly, so that, even when the same discharge voltage is applied, the output power therefrom is large compared to the other regions, whereas in the following plateau region and stable region, the effects of stopping laser oscillation become smaller, and the pulse generation effects up until immediately prior thereto (i.e. rises in electrode temperature, laser gas disturbance, etc.) are more strongly sustained.

With the prior art described in the foregoing, furthermore, spike killer control is implemented for all pulses produced by the continuous pulse generation, wherefore the volume of data in memory becomes large, so that not only is enormous memory capacity required, but considerable time is needed to read the data out of memory. These are problems.

DISCLOSURE OF THE INVENTION

The present invention has been devised in view of the situation described above. An object of the present invention, therefore, is to provide a laser device wherewith the pulse energy of all pulses produced by continuous pulse generation is made continually, uniform, and both laser light and laser machining precision are further improved.

The present invention provides a laser device which repeatedly performs a burst mode operation, wherein an operation of alternately implementing continuous oscillation actions to pulse-generate laser light continuously a prescribed number of times and stopping actions for stopping the pulse generations only during prescribed oscillation stop intervals constitutes one burst cycle, and which controls a laser power supply voltage so that energy of each output of the pulse generation falls within a prescribed target value range, characterized in that the laser device comprises:

voltage data table means for, taking pulse numbers indicating order of pulses in one burst cycle and a plurality of different oscillation stop intervals as parameters, recording beforehand initial values for the power supply voltage, making output of each of the pulse generations a value within a prescribed allowable value range near the target value, respectively; control gain setting means for dividing each burst cycle containing a plurality of pulses into a plurality of blocks, setting control gains used when correcting the power supply voltage values stored in the power supply voltage data table means to values that differ by block units so that those values are smaller the smaller are the pulse numbers of the pulses contained in the block, dividing the oscillation stop intervals into pluralities of blocks according to size of the intervals, and setting control gains to values that differ by block units so that those values are smaller the larger are the oscillation stop intervals contained in the blocks; oscillation stop interval measuring means for measuring the oscillation stop intervals in each burst cycle;

oscillation control means for reading out power supply voltage values from the power supply voltage data table means corresponding to measured oscillation stop intervals and corresponding to the pulse numbers, each burst cycle, and performing pulse generation in accordance with the power supply voltage values read out; monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and the oscillation stop intervals measured, using the differences and the control gains of the control gain setting means set in the blocks corresponding to those pulse numbers and to the oscillation stop intervals measured.

As based on the invention so described, when correcting the power supply voltage data stored in the power supply voltage data table, the control gains used in making these corrections are divided into groups corresponding to pulse numbers and oscillation stop intervals, and different values are set in units of these groups. Furthermore, these grouped control gains are set with different values in block units so that, for blocks divided according to pulse number, the values become smaller as the pulse numbers contained in the blocks become smaller, while, for blocks divided according to oscillation stop interval, the values become smaller as the intervals become larger.

That being so, as based on the present invention, power supply voltage control is implemented such that the relationship between the power supply voltage and the pulse light power which was not linear becomes a pseudo-linear relationship, and it becomes possible to make the output of all pulses uniform with high precision even when the oscillation stop interval changes in various ways, so that the exposure light and optical machining precision can be improved even further.

As based on the present invention, moreover, a laser device which repeatedly performs a burst mode operation, wherein an operation of alternately implementing continuous oscillation actions to pulse-generate laser light continuously a prescribed number of times and stopping actions for stopping the pulse generations only during prescribed oscillation stop intervals constitutes one burst cycle, and which controls a laser power supply voltage so that energy of each output of the pulse generation falls within a prescribed target value range, characterized in that the laser device comprises:

voltage data table means for, taking pulse numbers indicating order of pulses in one burst cycle and a plurality of different oscillation stop intervals as parameters, recording beforehand initial values for the power supply voltage, and making output of each of the pulse generations a value within a prescribed allowable value range near the target value; control gain setting means for dividing each burst cycle containing a plurality of pulses into a plurality of blocks, and setting control gains used when correcting the power supply voltage values stored in the power supply voltage data table means to values that differ by block units so that those values are smaller the smaller are the pulse numbers of the pulses contained in the blocks; oscillation stop interval measuring means for measuring the oscillation stop intervals in each burst cycle; oscillation control means for reading out power supply voltage values from the power supply voltage data table means corresponding to measured oscillation stop intervals and corresponding to the pulse numbers, each burst cycle, and performing laser oscillation in accordance with the power supply voltage values read out; monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and to the oscillation stop intervals measured, using the differences and the control gains of the control gain setting means set in the blocks corresponding to those pulse numbers.

As based on the invention so described, when correcting the power supply voltage data stored in the power supply voltage data table, the control gains used in making these corrections are divided into groups corresponding to pulse numbers, and different values are set in units of these groups. Furthermore, these grouped control gains are set with different values in block units so that the values become smaller as the pulse numbers contained in the blocks become smaller.

That being so, as based on this invention, power supply voltage control is implemented such that the relationship between the power supply voltage and the pulse light power which was not linear becomes a nearly pseudo-linear relationship, and it becomes possible to make the output of all pulses uniform with high precision, so that the exposure light and optical machining precision can be improved even further.

The present invention further provides a laser device which repeatedly performs a burst mode operation, wherein an operation of alternately implementing continuous oscillation actions to pulse-generate laser light continuously a prescribed number of times and stopping actions for stopping the pulse generations only during prescribed oscillation stop intervals constitutes one burst cycle, and which controls a laser power supply voltage so that energy of each output of the pulse generation falls within a prescribed target value range, characterized in that the laser device comprises:

voltage data table means for, taking pulse numbers indicating order of pulses in one burst cycle and a plurality of different oscillation stop intervals as parameters, recording beforehand initial values for the power supply voltage, and making output of each of the pulse generations a value within a prescribed allowable value range near the target value, respectively; control gain setting means for dividing the oscillation stop intervals into a plurality of blocks according to size of those intervals, and setting control gains used when correcting the power supply voltage values stored in the power supply voltage data table means to values that differ by block units so that those values are smaller the larger are the oscillation stop interval contained in the blocks; oscillation stop interval measuring means for measuring the oscillation stop intervals in each burst cycle; oscillation control means for reading out power supply voltage values from the power supply voltage data table means corresponding to measured oscillation stop intervals and corresponding to the pulse numbers, each burst cycle, and performing pulse oscillation in accordance with the power supply voltage values read out; monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and to the measured oscillation stop intervals, using the differences and the control gains of the control gain setting means set in the blocks corresponding to the oscillation stop intervals measured.

As based on the invention so described, when correcting the power supply voltage data stored in the power supply voltage data table, the control gains used in making these corrections are divided into groups corresponding to oscillation stop intervals, and different values are set in units of these groups. Furthermore, these grouped control gains are set with different values in block units so that the values become smaller as the oscillation stop intervals contained in the blocks become larger.

That being so, as based on this invention, power supply voltage control is implemented such that the relationship between the power supply voltage and the pulse light power which was not linear becomes a nearly pseudo-linear relationship, and it becomes possible to make the output of the pulses uniform with high precision, even when the oscillation stop interval has changed in various ways, so that the exposure light and optical machining precision can be improved even further.

BRIEF DESCRIPTION OF THE DRAWINGS

FIGS. 5(a) and 5(b) are time charts for the self recovery mode and the self locking mode;

FIGS. 6(a) and 6(b) are detailed time charts for the self recovery mode;

BEST MODE FOR CARRYING OUT THE INVENTION

Embodiments of the present invention are now described with reference to the attached drawings.

Figure 2:
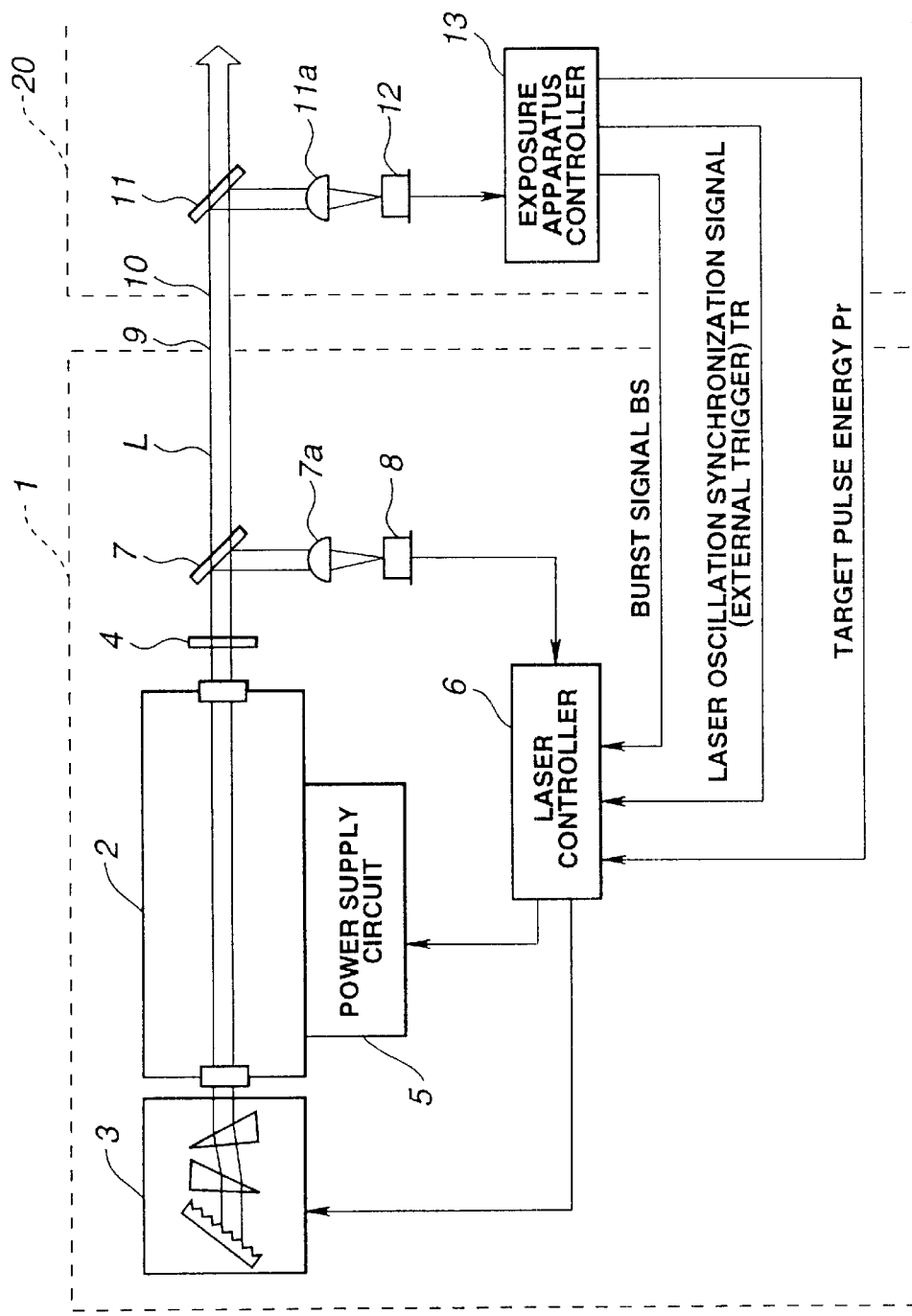
FIG. 2 is a block diagram of the configuration of an embodiment of this invention.

FIG. 2 diagrams a configuration wherein a laser device according to the present invention is employed as the light source in a stepper that performs micro-projection exposure processing for semiconductor circuit patterns. More specifically, a narrowed-band excimer number laser 1 is used as the laser device and a stepper is used as the micro-projection exposure device 20.

Figure 10:
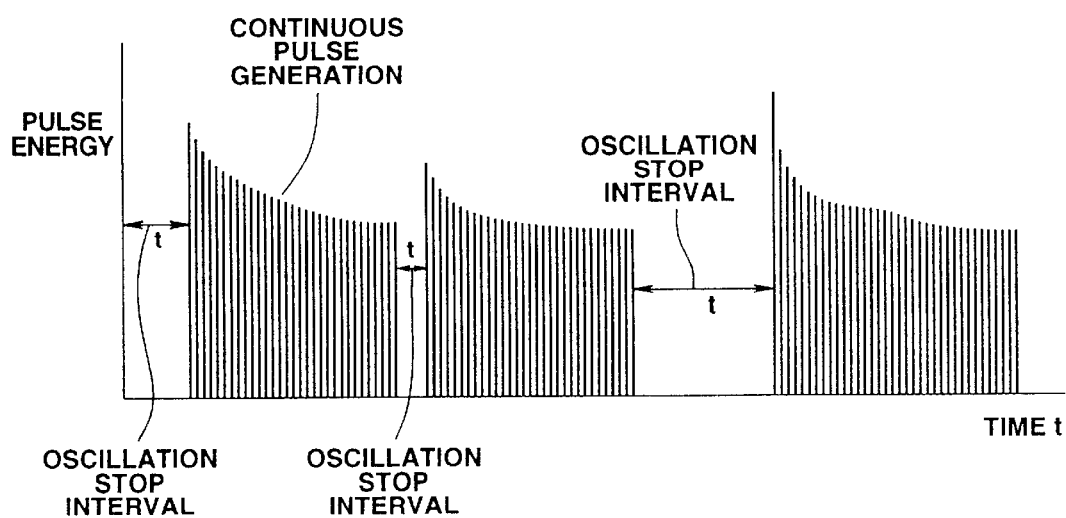
FIG. 10 is a diagram representing pulse energy waveforms during a burst operation when the charging voltage is kept constant.
Figure 11:
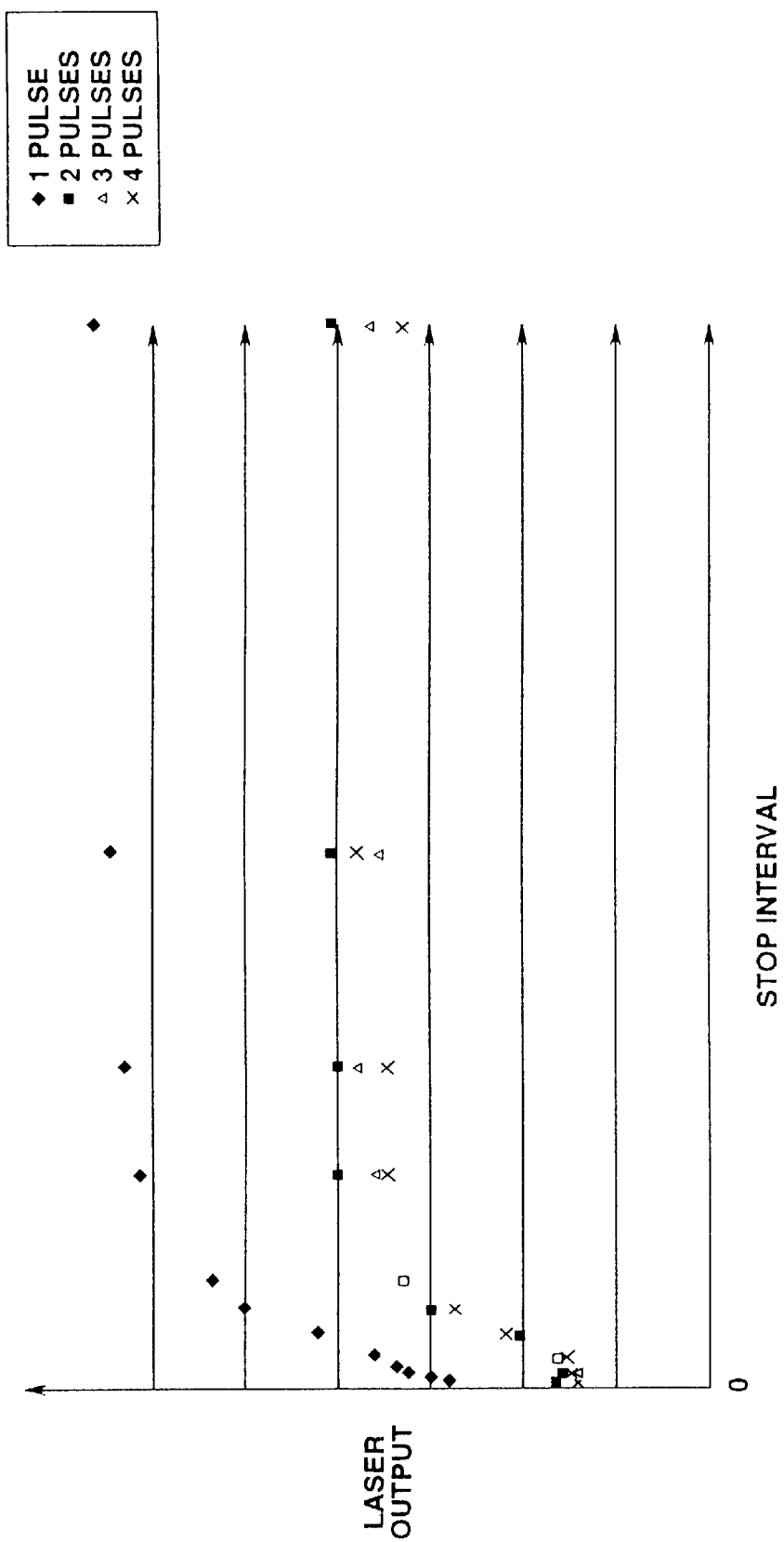
FIG. 11 is a diagram showing the relationship between oscillation stop intervals and laser output.
Figure 12:
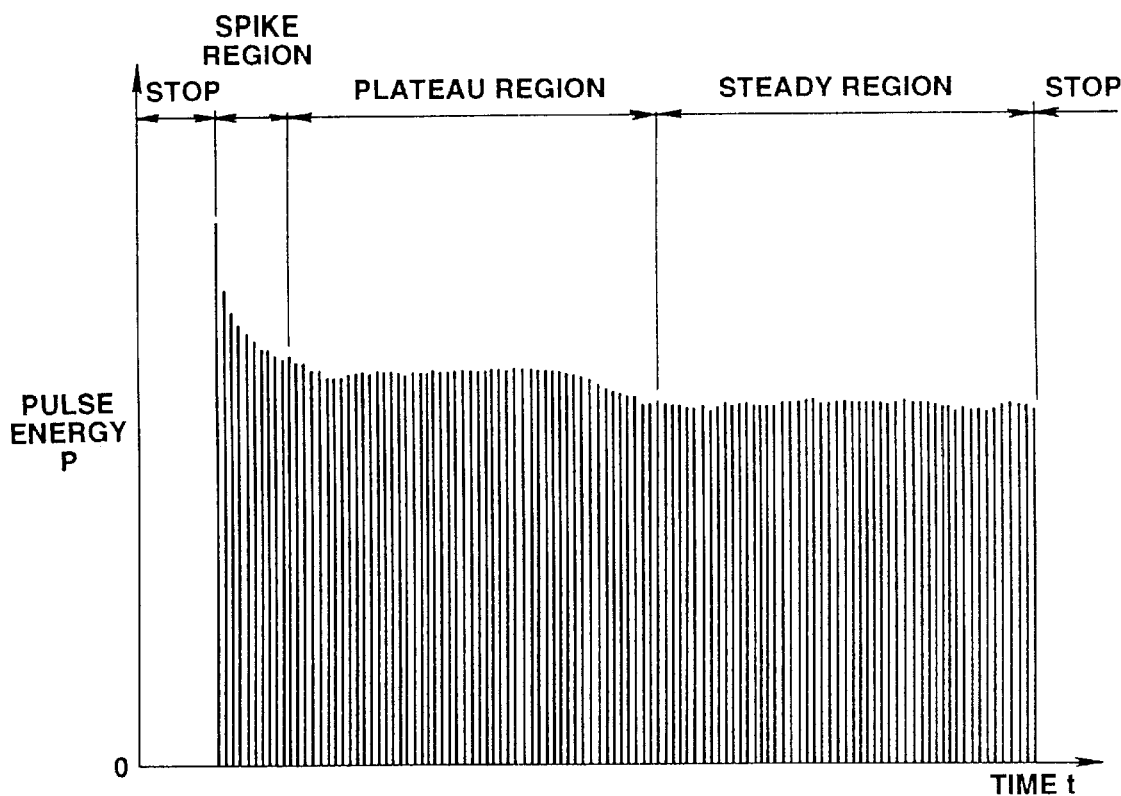
FIG. 12 is an enlarged diagram representing pulse energy waveforms in one burst cycle.

A laser chamber 2 in the excimer laser 1 has discharge electrodes, etc. (not shown) and performs laser oscillation by exciting laser gas consisting of Kr, $F_2$, Ne, or the like, with which the laser chamber 2 is filled, by discharges across the discharge electrodes. The emitted light is narrowed into a narrow band by a band narrowing unit 3, is returned back to the laser chamber 2 and amplified, and output as oscillating laser light L via a front mirror 4. Part of the output light is returned back to the laser chamber 2 and laser oscillation occurs. The laser light L, as is diagrammed in FIG. 10, mentioned earlier, is output intermittently in a burst mode operation that alternately repeats a continuous oscillation operation for generating pulses continuously a prescribed number of times in a prescribed cycle, and a stop operation (oscillation stop interval) for stopping the continuous pulse oscillation for a prescribed interval after the continuous oscillation operation.

A laser power supply circuit 5 implements discharges by applying a potential difference V across the discharge electrodes in response to voltage data supplied from a laser controller 6. In the laser power supply circuit 5, after momentarily building up a charge in a charging circuit (not shown), discharges are performed by the action of a switch element such as a GTO or thyratron.

The laser light L that is generated by the oscillator comprising the front mirror 4, laser chamber 2, and band narrowing unit 3 is split by a beam splitter 7 so that a part thereof is sampled by being shunted through a lens 7a to a light monitor module 8. The remainder of the laser light L passes through a slit 9 and proceeds to an exposure device 20. The slit 9 also functions as a shutter for interrupting the laser light output.

In the light monitor module 8, every time a pulse oscillation is performed, the energy Pi (where i=1, 2, 3, ...) for each pulse of the output laser light L is detected. This detected pulse energy value Pi is sent to the laser controller 6, and stored in a table as the energy Pji for the i'th pulse in the j'th pulse group. In the light monitor module 8, furthermore, the spectrum line width and wavelength of the laser light L are also detected, and these data are input to the laser controller 6.

The following signals are input to the laser controller 6 from the exposure device 20.

Figure 3:
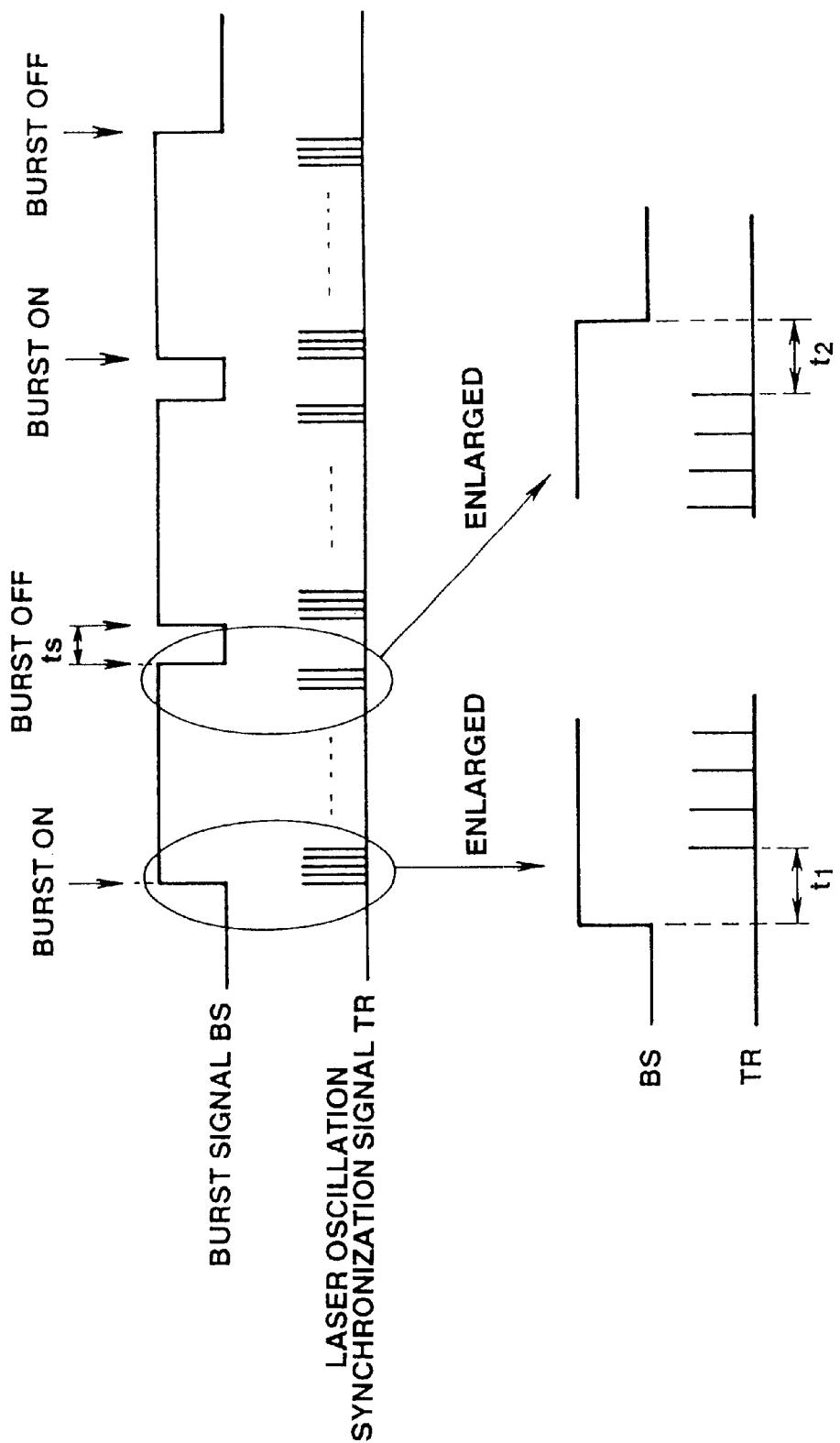
FIG. 3 is a time chart for burst signals and laser oscillation synchronization signals.

Burst signal BS (cf. FIG. 3)

Laser oscillation synchronization signal (external trigger) TR (cf. FIG. 3)

Target pulse energy value Photosensitive drum

The laser oscillation synchronization signal TR functions as the trigger signal for each pulse during continuous pulse generation in the laser device 1. The burst signal BS functions so as to start the continuous oscillation operation in the laser device 1 on its rise (burst on), and stop the continuous oscillation operation in the laser device 1 on its fall (burst off). The setup is such that, after a prescribed time interval T1 from the time of burst on, the first laser oscillation synchronization signal TR is generated, and, after a prescribed time interval T2 from the generation of the last laser oscillation synchronization signal TR, burst off is implemented.

In the laser controller 6, based on these input signals, when the continuous pulses are generated, table control is implemented using the discharge voltage data table set beforehand in the spike region that contains the first ten or so pulses. In the regions that follow thereafter, the discharge voltage data table is not used, and pulse-by-pulse control (feedback control) is implemented that controls the discharge voltage with reference to the discharge voltages of pulses already generated in that burst cycle. The details of this control are described farther below. In the laser controller 6, furthermore, the oscillation stop interval t is measured for each burst cycle. This measured oscillation stop interval is used in the table control described above.

In the exposure device 20, a beam splitter 11 is provided for sampling part of the laser light L that is incident thereon via the slit 10. That sampled light passes through a lens 11a and enters a light monitor module 12. In the light monitor module 12, the energy Pi' per pulse of the incident laser light L is detected. This detected energy value Pi' is input to an exposure device controller 13. The laser light that passes through the beam splitter 11 is used in micro-projection exposure processing.

In the exposure device controller 13, the micro-projection exposure processing and the movement of the stage on which the wafers are placed is controlled, wafer exchange is controlled, and the operations of sending the laser oscillation synchronization signals TR, the burst signals BS, and the target pulse energy values Pr to the laser device 1 are executed.

The discharge voltage control implemented in this embodiment is now described with reference to FIG. 1.

Figure 1:
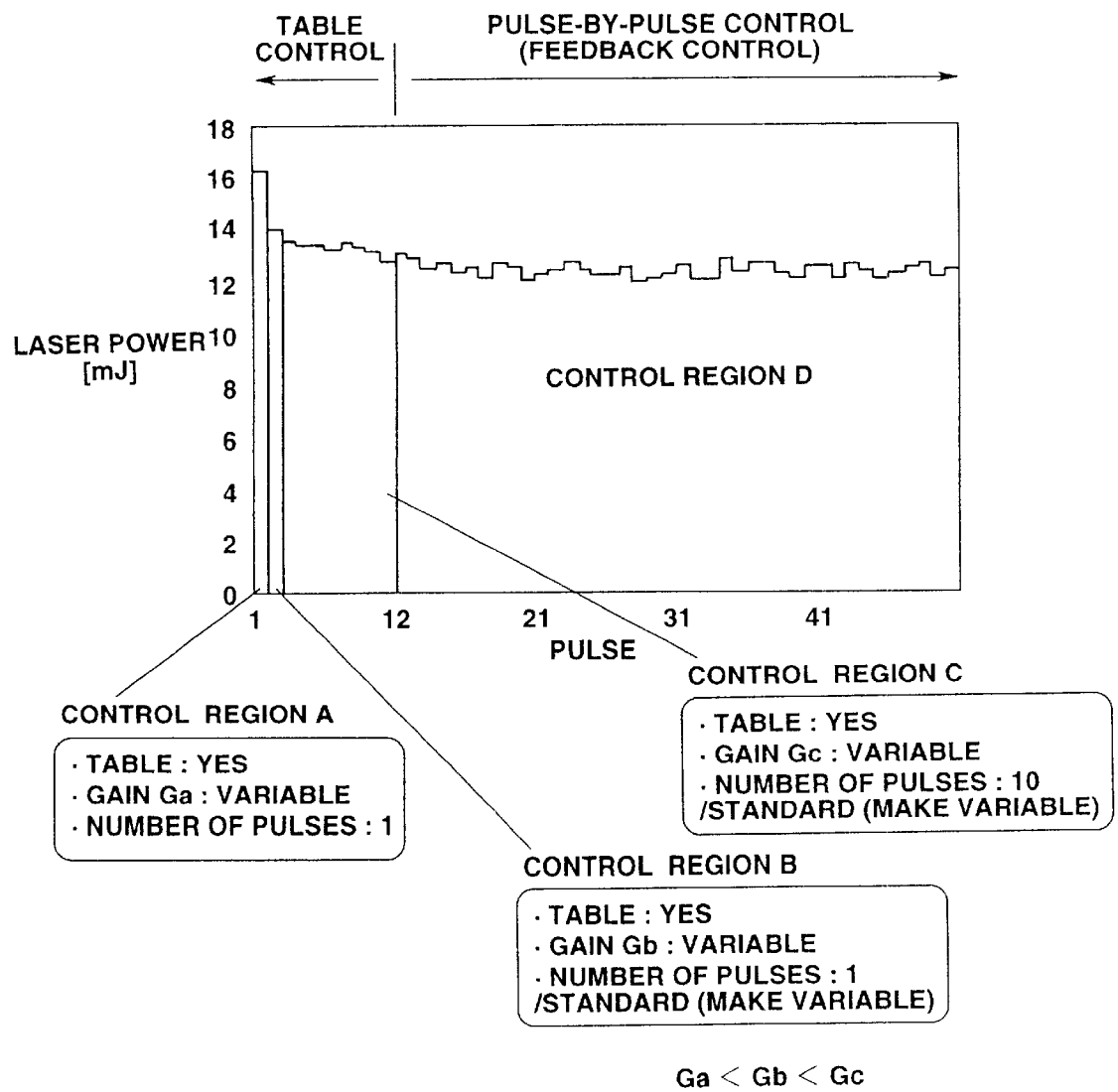
FIG. 1 is a diagram of one burst cycle divided into control regions in an embodiment of this invention.

FIG. 1 represents changes in the output of laser pulses in one burst cycle when the discharge voltage is kept constant. As described earlier, the first pulse generated has the largest output power because the laser stabilizes during the oscillation stop interval immediately preceding it. The pulse output power of the second and following pulses gradually declines because oscillations are repeated under conditions wherein the effects of the immediately preceding laser oscillations are greatly felt. In this case, the laser enters a steady state from the 12th pulse generation on, whereupon roughly the same light energy is output.

These output laser pulse characteristics appear as more or less common characteristics throughout the entire burst cycle. Accordingly, in this embodiment, each burst cycle is divided into four control regions, A~D, based on pulse numbers, and different discharge voltage control is implemented for each of those control regions A~D.

In control region A, the only subject of control is the very first pulse generated, which has a pulse number of 1. In control region B, only the second pulse having the pulse number 2 is a subject of control. In control region C, ten pulses are the subject of control, namely the 3rd through the 12th pulse generated, having the pulse numbers 3~12. And in control region D, the pulses from the 11th pulse on are the subject of control.

In control regions A~C, discharge voltage control is implemented on the bases of discharge voltage data stored in the discharge voltage data table (built into the laser controller 6) determined beforehand. In control region D, however, control is performed without using the discharge voltage data table. More specifically, in control region D, the excitation intensity (charging voltage) necessary to make the pulse energy value of the current pulse coincide with the target value Pr is determined from the relationship between the excitation intensity (discharge voltage) of the pulse oscillation immediately preceding the current pulse and the energy value of that pulse, and control is performed to execute pulse generation using the excitation intensity so determined. This control is called pulse-by-pulse control (feedback control).

In the discharge voltage control performed in control regions A~C using the discharge voltage data table, furthermore, the value of a gain constant C is made different in units of the control regions A~C. More specifically, in the table control, the pulse energy Pi laser-generated by the discharge voltage data Vi (i=1, 2, ... n) stored in the discharge voltage data table is detected and the difference ΔPi (=Pi−Pr) with the target energy Pr is computed, a correction discharge voltage value Vi (=G·ΔP, where G is a gain constant) is computed according to that difference ΔPi, the discharge voltage datum Vi stored in the table is corrected by that correction discharge voltage value ΔVi, and a post-correction discharge voltage datum Vi' (=Vi+ΔV) is obtained. This gain constant G value is made to differ in units of the control regions A~C.

More specifically, if we take Ga to be the gain constant in the control region A, Gb to be the gain constant in the control region B, and Gc to be the gain constant in the control region C, then the inequality relationship Ga<Gb<Gc is made to hold.

Accordingly, in the control region A, the correction discharge voltage value ΔVi is found by ΔVi=Ga·ΔPi, in the control region B the correction discharge voltage value ΔVi is found by ΔVi=Gb·ΔPi, and in the control region C, the correction discharge voltage value ΔVi is found by ΔVi= Gc·ΔPi.

Thus the control gain G used when subjecting the discharge voltage data table to correction control is set at a value that differs in units of the control regions A~C divided according to pulse number. These control gains G, however, are also set at values that are different in units of control regions α~γ divided on the basis of the oscillation stop interval t.

Figure 4:
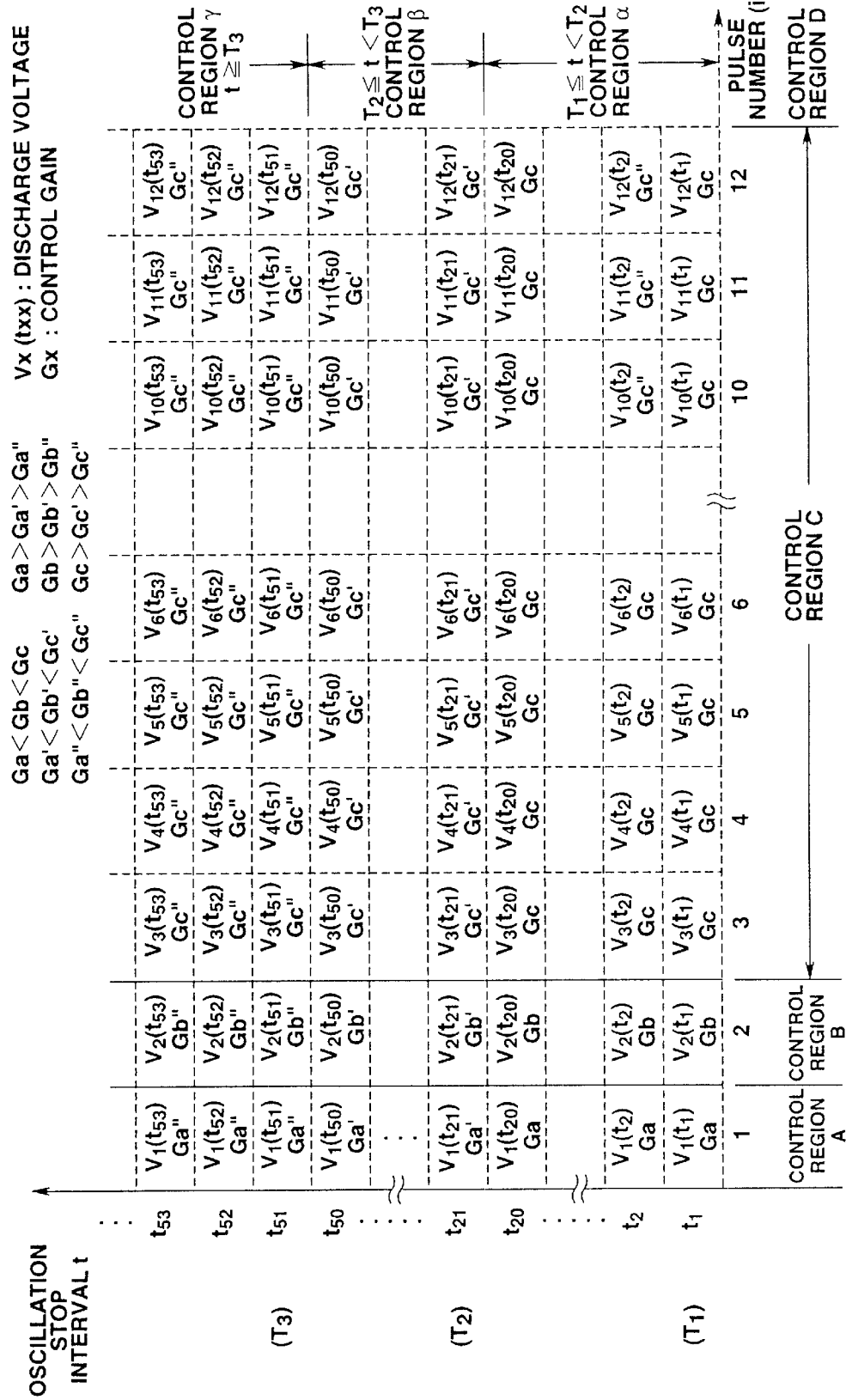
FIG. 4 is a diagram representing a power supply voltage data table and the way in which control gains are assigned.

In FIG. 4 are represented the discharge voltage data set and stored in the discharge voltage data table and the control gain setting procedure used when correcting the discharge voltage data set in the table. Pulse numbers (1≦i≦12) are plotted on the horizontal axis, and oscillation stop intervals (T1, T2, T3, T4, ...) are plotted on the vertical axis.

More specifically, in the discharge voltage data table, using the pulse number i and the oscillation stop interval t as parameters, different discharge voltage data Vi(tk) (where 1≦i≦12, 1≦k) are stored beforehand. For example, V1(t20) is the discharge voltage datum corresponding to a pulse number of 1 and an oscillation stop interval of t20, while V6(t50) is the discharge voltage datum corresponding to a pulse number of 6 and an oscillation stop interval of t50.

The control gain Gx (=Ga, Gb, Gc, Ga' ... ), on the other hand, is set at different values for each control region A~C divided according to pulse number (along the horizontal axis) and for each control region α~γ divided according to oscillation stop interval (along the vertical axis).

In this case, for example, Ga is set as the correcting control gain for the discharge voltage data V1(t1)~V1(t20) pertaining to the control region A and the control region α, Ga' is set as the correcting control gain for the discharge voltage data V1(t21)~V1(t50) pertaining to the control region A and the control region β, and Ga" is set as the correcting control gain for the discharge voltage data V1(t51) and following pertaining to the control region A and the control region γ.

Similarly, Gb is set as the correcting control gain for the discharge voltage data V2(t1)~V1(t20) pertaining to the control region B and the control region α, Gb' is set as the correcting control gain for the discharge voltage data V2(t26)~V1(t50) pertaining to the control region B and the control region β, and Gb" is set as the correcting control gain for the discharge voltage data V2(t51) and following pertaining to the control region B and the control region γ.

And Gc is set as the correcting control gain for the discharge voltage data V3(t1)~V1(t20) pertaining to the control region C and the control region α, Gc' is set as the correcting control gain for the discharge voltage data V3(t21)~V1(t50) pertaining to the control region C and the control region β, and Gc" is set as the correcting control gain for the discharge voltage data V3(t51) and following pertaining to the control region C and the control region γ.

The inequality relationships between these control gains are set as follows.

Ga<Gb<Gc

Ga'<Gb'<Gc'

Ga"<Gb"<Gc"

Ga>Ga'>Ga"

Gb>Gb'>Gb"

Gc>Gc'>Gc"

Figure 13:
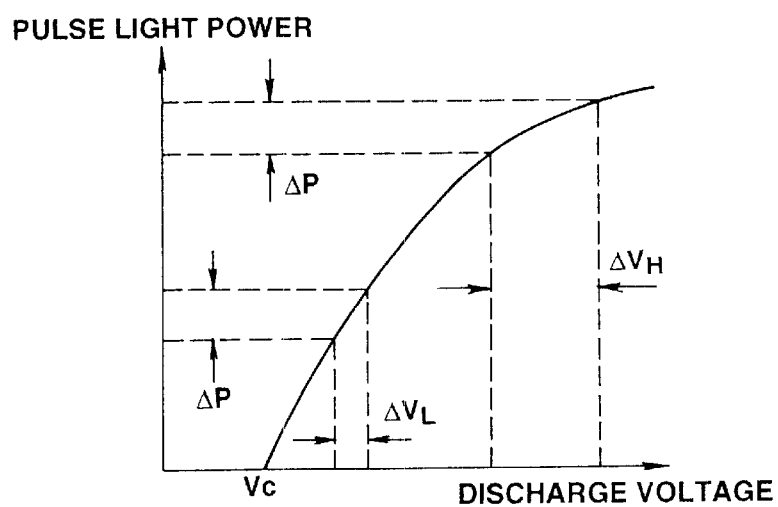
FIG. 13 is a diagram showing the relationship between discharge voltage and pulse light power.

The inequality relationships between these control gains are set in this manner in view of the relationship diagrammed in FIG. 13, mentioned earlier.

Next is described the procedure used in producing the discharge voltage data table diagrammed in FIG. 4 beforehand.

A self recovery mode is used when producing this discharge voltage data table. Then a self locking mode is used when checking whether or not the discharge voltage data table produced in the self recovery mode is appropriate.

(Self recovery mode)

When in the self recovery mode, the shutter (the slit 9 in FIG. 2) between the excimer laser 1 and the micro-projection exposure device 20 is closed so that laser light cannot enter the micro-projection exposure device 20. Then the excimer laser 1 is actually operated using a test operation pattern containing three representative stop intervals T1, T2, and T3 (where T1<T2<T3). These three representative stop intervals T1, T2, and T3 are the three oscillation stop intervals most frequently generated when operating this exposure device 20. They are set at suitable times according to the exposure device 20 and a wafer pattern or patterns frequently exposed. In FIG. 4, mentioned earlier, moreover, it is assumed that t1=T1, t21=T2, and t51=T3.

When in the self recovery mode, moreover, the number of pulses contained in one burst cycle is of course made to coincide with the number of pulses n during normal operation. Alternatively, that number maybe made smaller than n so long as it is a number of pulses containing up through the control region D.

As diagrammed in FIG. 6(*a*), the discharge voltages during this operation are given as V1(T1), V2(T1), . . . Vn(T1), V1(T2), V2(T2), . . . Vn(T2), V1(T3), V2(T3), . . . Vn(T3), in order, beginning from the lead pulse, for the three stop intervals T1, T2, and T3, and the light power for each pulse detected as a result of this operation are given as P1(T1), P2(Ti), . . . Pn(T1), P1(T2), P2(T2), . . . Pn(T2), P1(T3), P2(T3), . . . Pn(T3), respectively, for the three stop intervals T1, T2, and T3. When in the self recovery mode and the self locking mode, moreover, as diagrammed in FIG. 6(*b*), a timing signal TR' that is the same as the laser oscillation synchronization signal TR (cf. FIG. 3) sent from the exposure device 20 is generated in simulation by the laser controller 6, and continuous pulse oscillation is carried out synchronized with this pseudo signal TR'.

In the self recovery mode, furthermore, laser oscillation is repeated for the Q number of pulses (in FIG. 4, the 12 pulses belonging to the control regions A~C) among the pulses in one burst cycle for which discharge voltage data are to be produced, respectively, while adjusting the discharge voltage so as to satisfy Formula 1 below.

$$|Pi(T1)-Pr|<\Delta E1$$

and $$|Pi(T2)-Pr|<\Delta E2, \text{ and } |Pi(T3)-Pr|<\Delta E3 \qquad (1)$$

where $1\leq i\leq k$, $\Delta E1$, $\Delta E2$, and $\Delta E3$ are threshold values, Pr is a target value In addition, taking the characteristics diagrammed in FIG. 13, mentioned earlier, into consideration, it is preferable to set $\Delta E1>\Delta E2>\Delta E3$, but it is also permissible that $\Delta E1=\Delta E2=\Delta E3$.

In other words, laser oscillation is repeated while adjusting the discharge voltages V1(T1), V1(T2), and V1(T3) until the following inequality relationships are satisfied.

$$|P1(T1)-Pr|<\Delta E1,$$

$$|P1(T2)-Pr|<\Delta E2, \text{ and } |P1(T3)-Pr|<\Delta E3$$

When V1(T1), V1(T2), and V1(T3) are obtained which satisfy the above expressions, a discharge voltage data table is produced for the first pulse generated based on these three discharge voltage data.

More specifically, when discharge voltages V1(T1), V1(T2), and V1(T3) are obtained which correspond to the three representative oscillation stop intervals T1, T2, and T3, the relationship between the oscillation stop interval t and the discharge voltage V is set by connecting these three points with straight lines, substituting V=V1(T1) when t≦T1 and substituting V=V1(T3) when t≧T3. In the table presented in FIG. 4, for example, we have t1=T1, t21=T2, and t51=T3, and, by implementing the self recovery mode, the discharge voltages V1(t1), V1(t21), and V1(t51) are obtained, corresponding to t1 (=T1), t21 (=T2), and t51 (=T3). By subjecting these three data to linear interpolation, the discharge voltage data are obtained for the points positioned between these three points (T1<t<T2, T2<T3).

Then, when laser oscillation is repeated while adjusting the discharge voltages V2(T1), V2(T2), and V2(T3) for the second pulse generated, in the same manner, until $$|P2(T1)-Pr|<\Delta E1,$$

$$|P2(T2)-Pr|<\Delta E2, \text{ and } |P2(T3)-Pr|<\Delta E3$$

are satisfied, a discharge voltage data table is produced for the second pulse based on these three discharge voltage data, as described above.

In the same manner, the same adjustment oscillations are repeatedly executed for the first Q pulses, and discharge voltage data are obtained for these k pulses, respectively.

(Self locking mode)

The self locking mode is used between exposure operations. When the self locking mode has been selected, the shutter 9 between the excimer laser 1 and the micro-projection exposure device 20 is closed so that laser light does not enter the micro-projection exposure device 20, just as in the self recovery mode described above.

In this self locking mode, continuous pulse oscillations containing the representative stop intervals T1, T2, and T3 noted above are executed, respectively, each cycle, as diagrammed in FIG. 5(*b*), and it is confirmed whether or not the detected light pulses respectively satisfy Equation 1 above. When it is found that Equation 1 is so satisfied, an exposure enable signal is sent to the micro-projection exposure device 20 and the shutter between the excimer laser 1 and the micro-projection exposure device 20 is opened. When Equation 1 is not satisfied, an exposure disable signal is sent to the micro-projection exposure device 20, and discharge voltage data adjustment oscillations are performed in the self recovery mode as described earlier.

Next is described the action of correcting the discharge voltage data table diagrammed in FIG. 4.

This correcting action differs depending on whether the actual oscillation stop interval t coincides or does not coincide with the three representative oscillation stop intervals T1, T2, and T3 noted earlier.

The action taken when the oscillation stop interval t of the current burst cycle does not coincide with T1, T2, and T3 is described first.

For the first Q pulses in a burst cycle, as described earlier, discharge voltage data corresponding to the oscillation stop interval t in that burst cycle are read out from the table, and laser oscillations are performed using discharge voltages corresponding to the discharge voltage data so read out. As a result, values of Pi ($1\leq i\leq Q$) are obtained for the actual output of each pulse. Next, the difference $\Delta Pi$ (=Pi−Pr)

between the target energy Pr and the detected value Pi for each pulse is computed for each pulse, and these differences are compared with a prescribed threshold value E.

When a pulse is generated for which it has been determined in this comparison that $|\Delta Pi|>\Delta E$, only those discharge voltage data having a pulse number such that $|Pi|>\Delta E$ in the Q discharge voltage data corresponding to the oscillation stop interval t at issue are subjected to correction and update ($Vi'=Vi+\Delta Pi \cdot Gx$), using the corresponding control gain Gx.

If we assume, for example, in FIG. 4, that the current oscillation stop interval is t20, then, as a result of the oscillation, if we also assume that the relationship $|Pi|>\Delta E$ has developed in the pulses numbered 2 and 4, only those power supply voltage data V2(t20) and V4(t20) stored in the table will be corrected and updated according to the following formulas.

$$V2(t20)'=V2(t20)+Gb \cdot (Pr-P2)$$

$$V4(t20)'=V4(t20)+Gc \cdot (Pr-P4)$$

In other words, when the oscillation stop interval t measured does not correspond with T1, T2, or T3, of the discharge voltage data for the pulses for which $|Pi|>\Delta E$ has developed, only those discharge voltage data corresponding to the current oscillation stop interval t will be corrected and updated. As a result, the discharge voltage data will come to have an idiosyncratic point (cf. point 30 in FIG. 30) for which the linear interpolation relationship diagrammed in FIG. 7 breaks down.

Next is described the action when the measured oscillation stop interval t does coincide with either T1, T2, or T3.

In these cases, for pulses having the pulse numbers for which $|Pi|>\Delta E$ has developed, not only those discharge voltage data corresponding to the current oscillation stop interval (either T1, T2, or T3 in this case) are corrected and updated, but all discharge voltage data (in all oscillation stop intervals) corresponding to these pulse numbers at issue are corrected and updated. When these corrections are being made, three different control gains (Gx, Gx', and Gx") set for each control region $\alpha$-$\gamma$ are used.

In oscillations where the oscillation stop interval t coincides with T2 (=t21), for example, the relationship $|\Delta Pi|>\Delta E$ is made to develop in the pulses having the pulse number 5.

In this case, all discharge voltage data V5(t1)~V5(t53) ~corresponding to a pulse number of 5 will be corrected and updated according to the following formulas.

Discharge voltage data for t1–t20:
    $V5(t1)' = V5(t1) + Gc \cdot (Pr - P5)$
    .
    .
    .
    $V5(t20)' = V5(t20) + Gc \cdot (Pr - P5)$
Discharge voltage data for t21–t50:
    $V5(t21)' = V5(t21) + Gc' \cdot (Pr - P5)$
    .
    .
    .
    $V5(t50)' = V5(t50) + Gc' \cdot (Pr - P5)$
Discharge voltage data for t51–:
    $V5(t51)' = V5(t51) + Gc" \cdot (Pr - P5)$
    .
    .
    .

Figure 7:
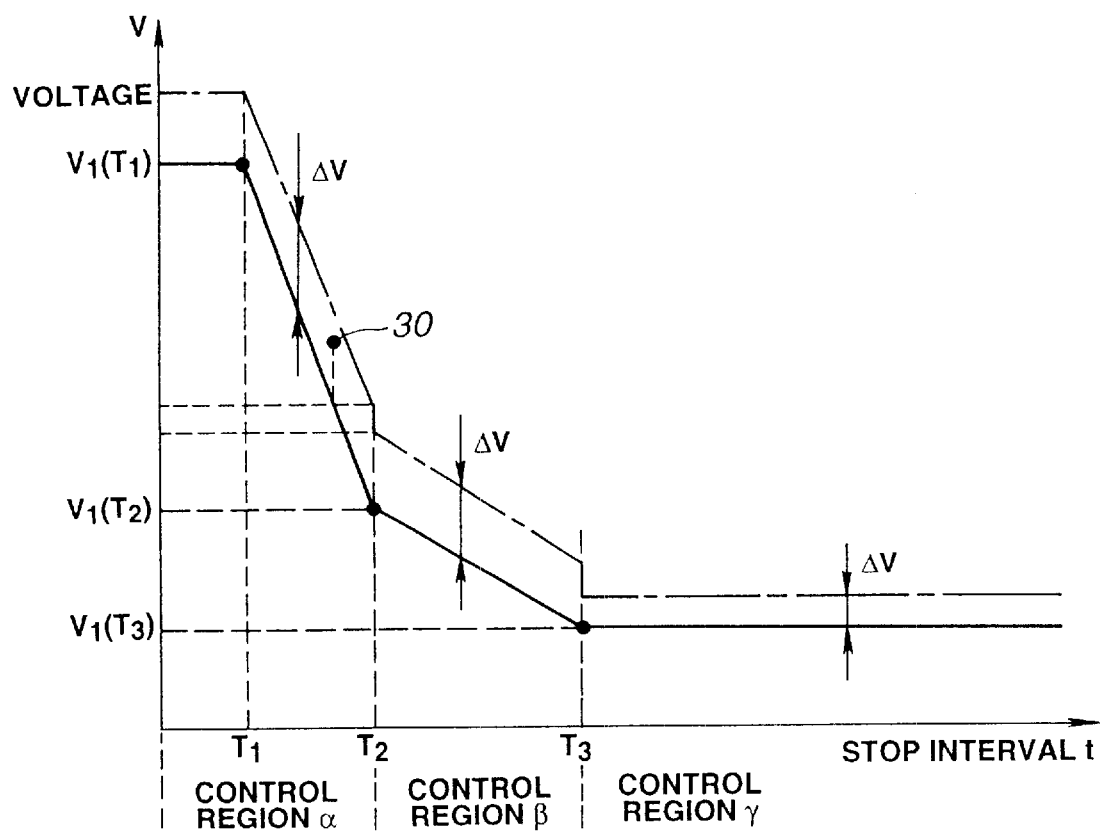
FIG. 7 is a diagram of the way in which the power supply voltage data stored in the power supply voltage data table are prepared.

The single-dotted broken line in FIG. 7 represents graphically how this correction is done. By performing corrections with different control gains for each control region $\alpha$- $\gamma$, the relationship between the post-correction oscillation stop intervals and the discharge voltages becomes discontinuous. That is, when the stop interval is T2, there will be two discharge voltage data, and when the stop interval is T3 there will also be two discharge voltage data. Accordingly, in such cases, a rule of thumb or the like must be devised for determining which selection to make, and then one discharge voltage datum or the other selected according to that rule.

In the foregoing have been given the particulars for discharge voltage data table control for controlling the first 10 pulses or so.

Next is described each pulse control implemented for pulses contained in the control region D diagrammed in FIG. 1.

In each of these pulse controls, the discharge voltage V for the pulse at issue is determined using the pulse energy value Pi for pulses already output in the current burst cycle and the discharge voltage Vi at that time.

For the pulse numbers referenced, there will be the following values:

(1) the pulse energy value Pi for the pulse immediately prior to the current pulse, and the charging voltage Vi at that time, (2) the pulse energy value Pi for the pulse that is N pulses (where N=2 or N=3, etc.) prior to the current pulse, and the charging voltage Vi at that time, and (3) the average value of the pulse energies Pi~Pi+n for n pulses having younger pulse numbers than the pulse number of the current pulse, and the average value of the charging voltages Vi~Vi+n corresponding thereto, etc.

Next, the charging voltage V needed to make the pulse energy the target value Pr is computed using the charging voltage Vi and the pulse energy value Pi read out as described in the foregoing.

More specifically, the pulse energy value Pi of the data read out (Pi, Vi) is compared against the target energy value Pr. If Pi=Pr, the charging voltage is set so that V=Vi. If Pr>Pi, it is set so that V=Vi+Gd·$\Delta$Vc (where $\Delta$Vc is a prescribed setting value). And if Pr<Pi, it is set so that V=Vi−Gd·$\Delta$Vc.

It is preferable that voltages in the plateau region be computed on the bases of the plateau region pulse voltage.

The foregoing concludes the details of the pulse-by-pulse control performed on pulses in the first control region D.

Figure 8:
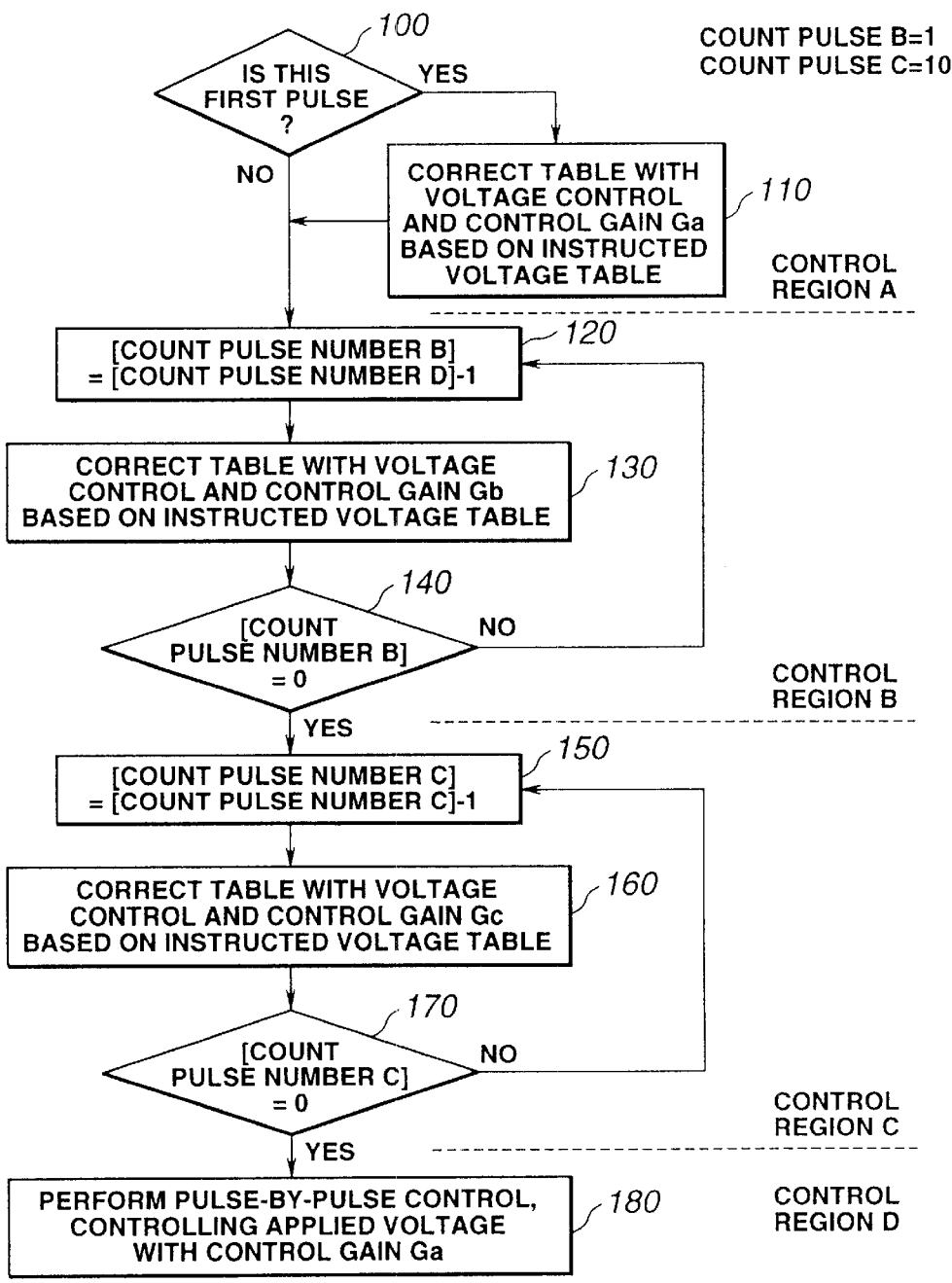
FIG. 8 is a flowchart of discharge voltage control action in one burst cycle.
Figure 9:
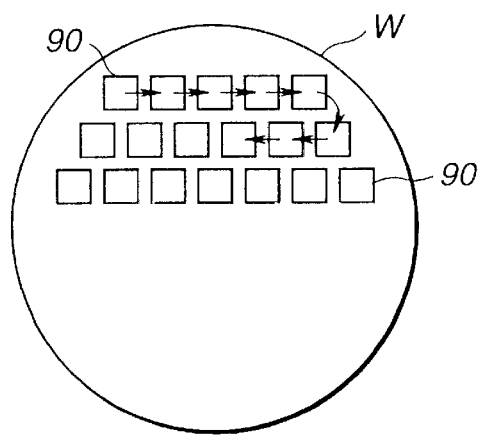
FIG. 9 is a plan showing IC chips on a wafer.

The discharge voltage control performed in one burst cycle is now described in order, following the flowchart given in FIG. 8.

At the point where the current burst cycle starts, the oscillation stop interval t for that burst cycle is measured. Next, when the current burst cycle begins, a determination is made as to whether or not the current pulse is the first pulse. If it is the first pulse, the table control for control region A is executed (steps 100 and 110). Specifically, the power supply voltage datum V1 corresponding both to the measured oscillation stop interval t and to pulse number 1 is read out from the power supply voltage data table, and the applied voltage is controlled so that it coincides with the power supply voltage V1 so read. The output P1 of the pulse actually generated by this applied voltage V1 is monitored by the light monitor module 8. The laser controller 6 compares this monitor value P1 with the target value Pr ($\Delta$P1=Pr−P1). If $\Delta$P1>$\Delta$E, the table data corresponding to pulse number 1 is corrected using the control gain Ga. When, moreover, the measured oscillation stop interval t coincides with either T1, T2, or T3 as noted above, all of the table data corresponding to pulse number 1 are corrected and updated, whereas, when this interval t does not so coincide, of the table data corresponding to pulse number 1, only those table data corresponding to that oscillation stop interval are corrected.

Next, after the count pulse value B (1 in this case) that was set has been decremented (−1), the table control for control region B is executed (steps 120 and 130). Specifically, the power supply voltage datum V2 corresponding both to the measured oscillation stop interval t and to pulse number 2 is read out from the power supply voltage data table, and the applied voltage is controlled so that it coincides with the power supply voltage V2 so read. The output P2 of the pulse actually generated by this applied voltage V2 is monitored by the light monitor module 8. The laser controller 6 compares this monitor value P2 against the target value Pr (ΔP2=Pr−P2). If ΔP2>ΔE, the table data corresponding to pulse number 2 is corrected using the control gain Gb. When, moreover, the measured oscillation stop interval t coincides with either T1, T2, or T3 as noted above, all of the table data corresponding to pulse number 2 are corrected and updated, whereas, when this interval t does not so coincide, of the table data corresponding to pulse number 2, only those table data corresponding to that oscillation stop interval are corrected, as described in the foregoing.

Next, a determination is made as to whether or not the count pulse value B coincides with 0 or not. If it does not so coincide, the table control for the control region B is repeated until B=0 (step 140). In this case B is set so that B=1, wherefore the sequence moves to the next step 150.

Next, after the count pulse value C (10 in this case) that was set has been decremented (−1), the table control for control region C is executed (steps 150 and 160). Specifically, the power supply voltage datum V3 corresponding both to the measured oscillation stop interval t and to pulse number 3 is read out from the power supply voltage data table, and the applied voltage is controlled so that it coincides with the power supply voltage V3 so read. The output P3 of the pulse actually generated by this applied voltage V3 is monitored by the light monitor module 8. The laser controller 6 compares this monitor value P3 against the target value Pr (ΔP3=Pr−P3). If ΔP3>ΔE, the table data corresponding to pulse number 3 is corrected using the control gain Gc. When, moreover, the measured oscillation stop interval t coincides with either T1, T2, or T3 as noted above, all of the table data corresponding to pulse number 3 are corrected and updated, whereas, when this interval t does not so coincide, of the table data corresponding to pulse number 3, only those table data corresponding to that oscillation stop interval are corrected, as described in the foregoing.

Next, a determination is made as to whether or not the count pulse value C coincides with 0 or not. If it does not so coincide, the table control for the control region C is repeated until C=0 (step 170). In this case C is set so that C=10, wherefore, as a result, the table control for the control region C will be executed for the 10 pulses having pulse numbers 3 12.

Once the table control operations using the power supply voltage data table have been completed as described above, thereafter the pulse-by-pulse control described earlier will be executed (step 180). During this pulse-by-pulse control, the discharge voltage V for the pulse at issue is determined using the pulse energy value Pi of pulses already output during the current burst cycle and the discharge voltage Vi in effect at that time.

In the embodiment described in the foregoing, the control gain G used in making table corrections is varied in control region (block) units in response to the pulse number and the oscillation stop interval, but it is permissible to vary the control gain G only in response to the pulse number, or, alternatively, to vary the control gain G only in response to the oscillation stop interval.

Namely, the correction discharge voltage value ΔVi is found by ΔVi=GA·(Pr−Pi) from the pulse energy value Pi, the target energy value Pr and the control gain GA, and the post-correction discharge voltage value Vi' is found by Vi'=Vi+ΔVi. However, it should be noted that when i indicative of the pulse number in one burst period is small, the control gain GA is also small.

In the embodiment described in the foregoing, moreover, the control gain G is varied in control region (block) units, but it is permissible to vary it in pulse number units, or to vary it in the basic units of the oscillation stop intervals (i.e. at t1, t2, t3, t4 in FIG. 4).

The number of pulses contained in each of the control regions A~D set in the embodiment described in the foregoing may be any number, and the number of control regions into which each burst cycle is divided may be any number.

In the embodiment described in the foregoing, furthermore, pulse-by-pulse control is performed in the control region D, but it is also permissible to perform discharge voltage control using the discharge voltage data table in control region D as in the other control regions A~C. In that case, the gain constant for the control region D may be made Gd, and the value of Gd set so that the relationship Ga<Gb<Gc<Gd is established.

In the embodiment described in the foregoing, moreover, when the table is being corrected, all of the table data corresponding to the pulse number at issue are corrected when the measured stop interval t coincides with a representative stop interval T1, T2, or T3, but it is also permissible to correct all of the table data when the measured stop interval t does not coincide with a representative stop interval T1, T2, or T3. Alternatively, it is also permissible, when the measured stop interval t does correspond to a representative stop interval T1, T2, or T3, to correct and update only those table data corresponding to that representative stop interval.

Industrial Applicability

In a laser device that uses laser beams to output prescribed light to expose semiconductors, polymer, materials, and inorganic materials and to output laser beams for machining devices that perform machining processes, constantly uniform pulse energy values are obtained when implementing burst mode operations wherein a continuous oscillation action for generating pulses of laser light a prescribed number of times continuously is alternated over and over with a stopping action for stopping the pulse generation for a prescribed time.

What is claimed is:

1. A control device for controlling a power source voltage of a laser device which repeatedly performs a burst mode operation in which an operation of alternately implementing continuous oscillation actions to pulse-generate laser light continuously a prescribed number of times and stopping actions for stopping the pulse generations only during prescribed oscillation stop intervals constitutes one burst cycle, so that energy of each output of the pulse generation falls within a prescribed target value range, wherein the control device comprises:

voltage data table means for, taking pulse numbers indicating order of pulses in one burst cycle and a plurality of different oscillation stop intervals as parameters, recording beforehand initial values for the power supply voltage, making output of each of the pulse generations a value within a prescribed allowable value range near the target values respectively;

control gain setting means for dividing each burst cycle containing a plurality of pulses into a plurality of blocks; setting, as control gains used when correcting the power supply voltage values stored in the power supply voltage data table means, small values for blocks containing pulses with small numbers and large values for blocks containing pulses with large numbers, dividing the oscillation stop intervals into pluralities of blocks according to size of the intervals, and setting, as control gains small values for blocks containing large oscillation stop intervals and large values for blocks containing small oscillation stop intervals;

oscillation stop interval measuring means for measuring the oscillation stop intervals in each burst cycle, oscillation control means for reading out, for each burst cycle, power supply voltage values from the power supply voltage data table means corresponding to measured oscillation s top intervals and corresponding to the pulse numbers, and performing pulse generation in accordance with the power supply voltage values read out;

monitor means for associating outputs of the pulses continuously generated with the pulse numbers and monitoring order thereof, and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and the oscillation stop intervals measured, using the differences and the control gains of the control gain setting means set in the blocks corresponding to those pulse numbers and to the oscillation stop intervals measured.

2. The control device according to claim 1, wherein the table correction means takes, as computation results of the corrections, values obtained by adding the power supply voltage values in the voltage data table means to values obtained by multiplying the control gains by the differences, and updates the power supply voltage values stored in the voltage data table means with the correction computation results.

3. The control device according to claim 1, wherein the power supply voltage data table determines beforehand, by pulse number, initial values of the power supply voltages corresponding to a plurality of representative oscillation stop intervals, and produces initial values for the plurality of power supply voltages for each pulse number by linear interpolation.

4. The control device according to claim 2, wherein, in the power supply voltage data table, power supply voltage data for oscillation stop intervals larger than largest of the plurality of oscillation stop intervals are replaced by power supply voltage data corresponding to largest of the plurality of oscillation stop intervals.

5. The control device according to claim 2, wherein, in the power supply voltage data table, power supply voltage data for oscillation stop intervals smaller than smallest of the plurality of oscillation stop intervals are replaced by power supply voltage data corresponding to smallest of the plurality of oscillation stop intervals.

6. The control device according to claim 2, wherein the table correction means, in cases where an oscillation stop interval measured by the oscillation stop interval measurement means coincides with any of the plurality of representative oscillation stop intervals, for pulses for which difference between output value of each pulse monitored by the monitor means and the target value exceeds the allowable limit, correct and update all power supply voltage values stored in the voltage data table means corresponding to pulse numbers of the pulses, respectively, individually, according to the difference, with a plurality of different control gains corresponding to those pulse numbers.

7. The control device according to claim 1, wherein the power supply voltage data table means store power supply voltage values only for a prescribed number of initial pulses in each burst cycle, and in that pulse oscillation control by the oscillation control means and stored power supply voltage data correction control by the table correction means are performed only for the prescribed number of initial pulses.

8. The control device according to claim 7, wherein, for pulses generated after the prescribed number of initial pulses, power supply voltage values for current pulse generations are computed on basis of monitored values for at least one pulse already output in current burst cycle obtained from the monitor means and on power supply voltage value at that time, and in that pulses are generated on basis of these power supply voltage values.

9. A control device for controlling a power source voltage of a laser device which repeatedly performs a burst mode operation in which an operation of alternately implementing continuous oscillation actions to pulse-generate laser light continuously a prescribed number of times and stopping actions for stopping the pulse generations only during prescribed oscillation stop intervals constitutes one burst cycle, so that energy of each output of the pulse generation falls within a prescribed target value range, wherein the control device comprises:

voltage data table means for, taking pulse numbers indicating order of pulses in one burst cycle and a plurality of different oscillation stop intervals as parameters, recording beforehand initial values for the power supply voltage, making output of each of the pulse generations a value within a prescribed allowable value range near the target value, respectively;

control gain setting means for dividing each burst cycle containing a plurality of pulses into a plurality of blocks, and setting, as control gains used when correcting the power supply voltage values stored in the power supply voltage data table means, small values for blocks containing pulses with small numbers and large values for blocks containing pulses with large numbers;

oscillation stop interval measuring means for measuring the oscillation stop intervals in each burst cycle;

oscillation control means for reading out, for each burst cycle power supply voltage values from the power supply voltage data table means corresponding to measured oscillation stop intervals and corresponding to the pulse numbers, and performing laser oscillation in accordance with the power supply voltage values read out;

monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and to the oscillation stop intervals measured, using the differences and the control gains of the control gain setting means set in the blocks corresponding to those pulse numbers.

10. The control device according to claim 9, wherein the table correction means take, as computation results of the corrections, values obtained by adding the power supply voltage values in the voltage data table means to values obtained by multiplying the control gains by the differences, and update power supply voltage values stored in the voltage data table means with the correction computation results.

11. The control device according to claim 9, wherein the power supply voltage data table determines beforehand, by pulse number, initial values of the power supply voltages corresponding to a plurality of representative oscillation stop intervals, and produces initial values for this plurality of power supply voltages for each pulse number by linear interpolation.

12. The control device according to claim 11, wherein, in the power supply voltage data table, power supply voltage data for oscillation stop intervals larger than largest of the plurality of oscillation stop intervals are replaced by power supply voltage data corresponding to largest of the plurality of oscillation stop intervals.

13. The control device according to claim 11, wherein, in the power supply voltage data table, power supply voltage data for oscillation stop intervals smaller than smallest of the plurality of oscillation stop intervals are replaced by power supply voltage data corresponding to smallest of the plurality of oscillation stop intervals.

14. The control device according to claim 11, wherein the table correction means, in cases where an oscillation stop interval measured by the oscillation stop interval measurement means coincides with any of the plurality of representative oscillation stop intervals, for pulses for which difference between output value of each pulse monitored by the monitor means and the target value exceeds the allowable limit, correct and update all power supply voltage values stored in the voltage data table means corresponding to pulse numbers of the pulses, respectively, according to the difference, with control gains corresponding to those pulse numbers.

15. The control device according to claim 9, wherein the power supply voltage data table means store power supply voltage values only for a prescribed number of initial pulses in each burst cycle, and in that pulse oscillation control by the oscillation control means and stored power supply voltage data correction control by the table correction means are performed only for the prescribed number of initial pulses.

16. The control device according to claim 15, wherein, for pulses generated after the prescribed number of initial pulses, power supply voltage values for current pulse generations are computed on basis of monitored values for at least one pulse already output in current burst cycle obtained from the monitor means and on power supply voltage value at that time, and in that pulses are generated on basis of these power supply voltage values.

17. A control device for controlling a power source voltage of a laser device which repeatedly performs a burst mode operation in which an operation of alternately implementing continuous oscillation actions to pulse-generate laser light continuously a prescribed number of times and stopping actions for stopping the pulse generations only during prescribed oscillation stop intervals constitutes one burst cycle, so that energy of each output of the pulse generation falls within a prescribed target value range, wherein the control device comprises:

voltage data table means for, taking pulse numbers indicating order of pulses in one burst cycle and a plurality of different oscillation stop intervals as parameters, recording beforehand initial values for the power supply voltage, and making output of each of the pulse generations a value within a prescribed allowable value range near the target value, respectively;

control gain setting means for dividing the oscillation stop intervals into a plurality of blocks according to size of those intervals, and setting, as control gains used when correcting the power supply voltage values stored in the power supply voltage data table means, small values for blocks containing large oscillation stop intervals and large values for blocks containing small oscillation stop intervals;

oscillation stop interval measuring means for measuring the oscillation stop intervals in each burst cycle;

oscillation control means for reading for each burst cycle, our power supply voltage values from the power supply voltage data table means corresponding to measured oscillation stop intervals and corresponding to the pulse numbers, and performing pulse oscillation in accordance with the power supply voltage values read out;

monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses and to the measure oscillation stop intervals, using the differences and the control gains of the control gain setting means set in the blocks corresponding to the oscillation stop intervals measured.

18. The control device according to claim 17, wherein the table correction means take, as computation results of the corrections, values obtained by adding the power supply voltage values in the voltage data table means to values obtained by multiplying the control gains by the differences, and update power supply voltage values stored in the voltage data table means with the correction computation results.

19. The control device according to claim 17, wherein the power supply voltage data table determines beforehand, by pulse number, initial values of the power supply voltages corresponding to a plurality of representative oscillation stop intervals, and produces initial values for this plurality of power supply voltages for each pulse number by linear interpolation.

20. The control device according to claim 19, wherein, in the power supply voltage data table, power supply voltage data for oscillation stop intervals larger than largest of the plurality of oscillation stop intervals are replaced by power supply voltage data corresponding to largest of the plurality of oscillation stop intervals.

21. The control device according to claim 19, wherein, in the power supply voltage data table, power supply voltage data for oscillation stop intervals smaller than smallest of the plurality of oscillation stop intervals are replaced by power supply voltage data corresponding to smallest of the plurality of oscillation stop intervals.

22. The control device according to claim 19, wherein the table correction means, in cases where an oscillation stop interval measured by the oscillation stop interval measurement means coincides with any of the plurality of representative oscillation stop intervals, for pulses for which difference between output value of each pulse monitored by the monitor means and the target value exceeds the allowable limit, correct and update all power supply voltage values stored in the voltage data table means corresponding to pulse numbers of the pulses, respectively, according to the difference, with a plurality of different control gains set in the control gain setting means.

23. The control device according to claim 17, wherein the power supply voltage data table means store power supply voltage values only for a prescribed number of initial pulses in each burst cycle, and in that pulse oscillation control by the oscillation control means and stored power supply voltage data correction control by the table correction means are performed only for the prescribed number of initial pulses.

24. The control device according to claim 23, wherein, for pulses generated after the prescribed number of initial pulses, power supply voltage values for current pulse generations are computed on basis of monitored values for at least one pulse already output in current burst cycle obtained from the monitor means and on power supply voltage value at that time, and in that pulses are generated on basis of these power supply voltage values.

25. A device for controlling a power source voltage of a laser device which repeatedly performs a burst mode operation in which an operation of alternately implementing continuous oscillation actions to pulse-generate laser light continuously a prescribed number of times and stopping actions for stopping the pulse generations only during prescribed oscillation stop intervals constitutes one burst cycle, so that energy of each output of the pulse generation falls within a prescribed target value range, wherein the control device comprises:

voltage data table means for, taking pulse numbers indicating order of pulses in one burst cycle as parameters, recording beforehand initial values for the power supply voltage, making output of each of the pulse generations a value within a prescribed allowable value range near the target value, respectively;

control gain setting means for dividing each burst cycle containing a plurality of pulses into a plurality of blocks, setting, as control gains used when correcting the power supply voltage values stored in the power supply voltage data table means, small values for blocks containing pulses having small numbers and large values for blocks containing pulses having large numbers;

oscillation control means for reading out, for each burst cycle, power supply voltage values from the power supply voltage data table means corresponding to the pulse numbers and performing laser generation in accordance with the power supply voltage values read out;

monitor means for associating outputs of the pulses continuously generated with the pulse numbers and monitoring order thereof; and table correction means for finding, for each pulse, differences between output values of the pulses monitored by the monitor means and the target values, and, for pulses for which this difference exceeds an allowable limit, correcting and updating the power supply voltage values stored in the voltage data table means corresponding to pulse numbers of those pulses, using the differences and the control gain of the control gain setting means set in the blocks corresponding to those pulse numbers.

* * * * *